United States Patent
Takayama et al.

(10) Patent No.: US 6,547,473 B2
(45) Date of Patent: Apr. 15, 2003

(54) FASTENING DEVICE FOR CONVEYING CART

(75) Inventors: Yukio Takayama, Kasugai (JP); Akihiro Yasuda, Kasugai (JP); Tsukasa Adachi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 09/809,188

(22) Filed: Mar. 16, 2001

(65) Prior Publication Data

US 2002/0021934 A1 Feb. 21, 2002

(30) Foreign Application Priority Data

Aug. 18, 2000 (JP) ........................................ 2000-248926

(51) Int. Cl.[7] ............................................... B65G 67/02
(52) U.S. Cl. .......................... 403/25; 414/584; 414/401
(58) Field of Search ................................ 414/401, 396, 414/584, 940; 403/25

(56) References Cited

U.S. PATENT DOCUMENTS

| | | | |
|---|---|---|---|
| 6,033,175 A | * 4/2000 | Pflueger et al. | 414/401 |
| 6,102,647 A | * 8/2000 | Yap | 414/940 |
| 6,238,283 B1 | * 5/2001 | Matsuyama et al. | 414/939 |
| 6,305,500 B1 | * 10/2001 | McCrandall et al. | 414/940 |
| 6,371,714 B1 | * 4/2002 | Sherard et al. | 414/401 |
| 6,494,671 B1 | * 12/2002 | Takaiti et al. | 414/809 |

FOREIGN PATENT DOCUMENTS

| | | |
|---|---|---|
| JP | 7-7005 | 2/1995 |
| JP | 2000-72226 | 3/2000 |

* cited by examiner

*Primary Examiner*—Lynne H. Browne
*Assistant Examiner*—Kenneth Thompson
(74) *Attorney, Agent, or Firm*—Armstrong, Westerman & Hattori, LLP (57) ABSTRACT

A fastening device for a conveying cart is used for fastening the conveying cart to a to-be-fastened apparatus. The device includes a flange provided on a side of the to-be-fastened apparatus, and having a pin standing therefrom, and a recess formed therein; and a fastening mechanism provided on a side of the conveying cart, and having a first hook member engaging with the pin of the flange so as to position the conveying cart with respect to the to-be-fastened apparatus, and a second hook member engaging with the recess of the flange so the to fasten the conveying cart to the to-be-fastened apparatus.

11 Claims, 10 Drawing Sheets

FASTENING DEVICE FOR CONVEYING CART

BACKGROUND OF THE INVENTION

1. Field of the Invention

The present invention relates to a fastening device for a conveying cart, and, in particular, a fastening device for fastening a conveying cart used for conveying semiconductor substrates between processing apparatuses, onto a processing apparatus used as a to-be-fastened apparatus.

Generally, many semiconductor manufacturing apparatuses are set in a semiconductor manufacturing factory, and, semiconductor devices are manufactured in which semiconductor substrates are conveyed between these semiconductor manufacturing apparatuses. The conveyance of semiconductor substrates is performed almost automatically. However, there are cases where it is difficult to perform conveyance of semiconductor substrates automatically due to reasons concerning the equipment of the factory. In such a case, a person performs conveyance of semiconductor substrates manually in a condition in which the semiconductor substrates are mounted on a conveying cart.

Further, when the semiconductor substrates are conveyed into a predetermined position of a semiconductor manufacturing apparatus, the conveying cart is fastened to the semiconductor manufacturing apparatus. Then, the semiconductor substrate mounted on the conveying cart is received by the semiconductor manufacturing apparatus by using an actuator provided on the semiconductor manufacturing apparatus or the conveying cart.

At this time, when the conveying cart is not precisely fastened to the semiconductor manufacturing apparatus which is regarded as a to-be-fastened apparatus, reception of the semiconductor substrate by the semiconductor manufacturing apparatus using the actuator may not be performed properly. Further, when a long time is required for fastening the conveying cart to the semiconductor manufacturing apparatus, an efficiency in manufacturing semiconductor devices is degraded. Accordingly, it is demanded that the conveying cart is fastened to the to-be-fastened apparatus easily and positively.

2. Description of the Related Art

In the related art, there is no specific standard for the fastening device for the conveying cart. Therefore, an original fastening device is used for each semiconductor manufacturing equipment. Japanese Laid-Open Patent Application No. 2000-72226 discloses one example thereof.

The fastening device disclosed in this publication is such that, a plate having a V-shape guiding block, a positioning block, and a pin provided thereon is provided on the side of the to-be-fastened apparatus thereof, and first and second rollers and hook are provided on the side of the conveying cart thereof.

Then, when the conveying cart is fastened to the to-be-fastened apparatus, the first roller is positioned and is caused to engage with the V-shaped guiding block, the conveying cart is rotated toward the to-be-fastened apparatus around the position at which the first roller and V-shape guiding block are engaged, and the hook is caused to engage with the pin.

In this state, the second roller is caused to engage with the positioning block, and the first roller is pressed toward the V-shape guiding block. Thereby, the conveying cart is fastened to the to-be-fastened apparatus.

However, in the above-described configuration, the plate having such a complicated configuration as having the V-shape guiding block, positioning block and pin provided thereto is provided on the side of the to-be-fastened apparatus. Accordingly, the configuration of the fastening device is complicated.

Further, in the above-described fastening device, the first roller should be positioned to the V-shape guiding block, and, then, the first roller should be caused to engage with the V-shape guiding block. Normally, the first roller is provided on the bottom surface of the conveying cart, and may not be easily viewed by an operator. Accordingly, it is troublesome for the operator to position and cause the first roller to engage with the V-shape guiding block.

Further, because an original fastening device is applied for each semiconductor manufacturing equipment as mentioned above, the conveying cart and fastening device are not compatible with other manufacturing equipment. Thereby, costs of the equipment increase, and, also, because the conveying cart cannot be used for a plurality of equipment in common, inconvenience occurs.

Further, in a case where an actuator or the like which is driven by electric power is provided on the conveying cart, it is necessary to provide, in addition to the fastening device, a power supply unit for supplying power to the actuator from the to-be-fastened apparatus. Thereby, a configuration of the conveying cart and to-be-fastened apparatus at the fastening position are complicated.

Further, at a time of fastening, it is necessary to perform the operation of mechanically fastening the conveying cart to the to-be-fastened apparatus and the operation of electrically connecting the conveying cart to the to-be-fastened apparatus. Thereby, the operation at a time of fastening is totally complicated.

SUMMARY OF THE INVENTION

The present invention has been devised in consideration to these problems, and an object of the present invention is to provide the fastening device for the conveying cart by which the conveying cart can be fastened to the to-be-fastened apparatus easily and positively.

A fastening device for a conveying cart, according to the present invention, used for fastening the conveying cart to a to-be-fastened apparatus, comprising:

a flange provided on a side of the to-be-fastened apparatus of the device, and having a pin standing therefrom, and a recess formed therein; and a fastening mechanism provided on a side of the conveying cart of the device, and having a first hook member engaging with the pin of the flange so as to position the conveying cart with respect to the to-be-fastened apparatus, and a second hook member engaging with the recess of the flange so as to fasten the conveying cart to the to-be-fastened apparatus.

Thereby, as an operator merely pushes the conveying cart, the first hook member of the fastening mechanism engages with the pin of the flange, and, also, the second hook member of the fastening mechanism engages with the recess of the flange. Thereby, the conveying cart is fastened to the to-be-fastened apparatus. Thus, it is possible to easily and positively fasten the conveying cart to the to-be-fastened apparatus with the simple configuration.

Other objects and further features of the present invention will become more apparent from the following detailed description when read in conjunction with the accompanying drawings.

DETAILED DESCRIPTION OF THE PREFERRED EMBODIMENT

Figure 1:
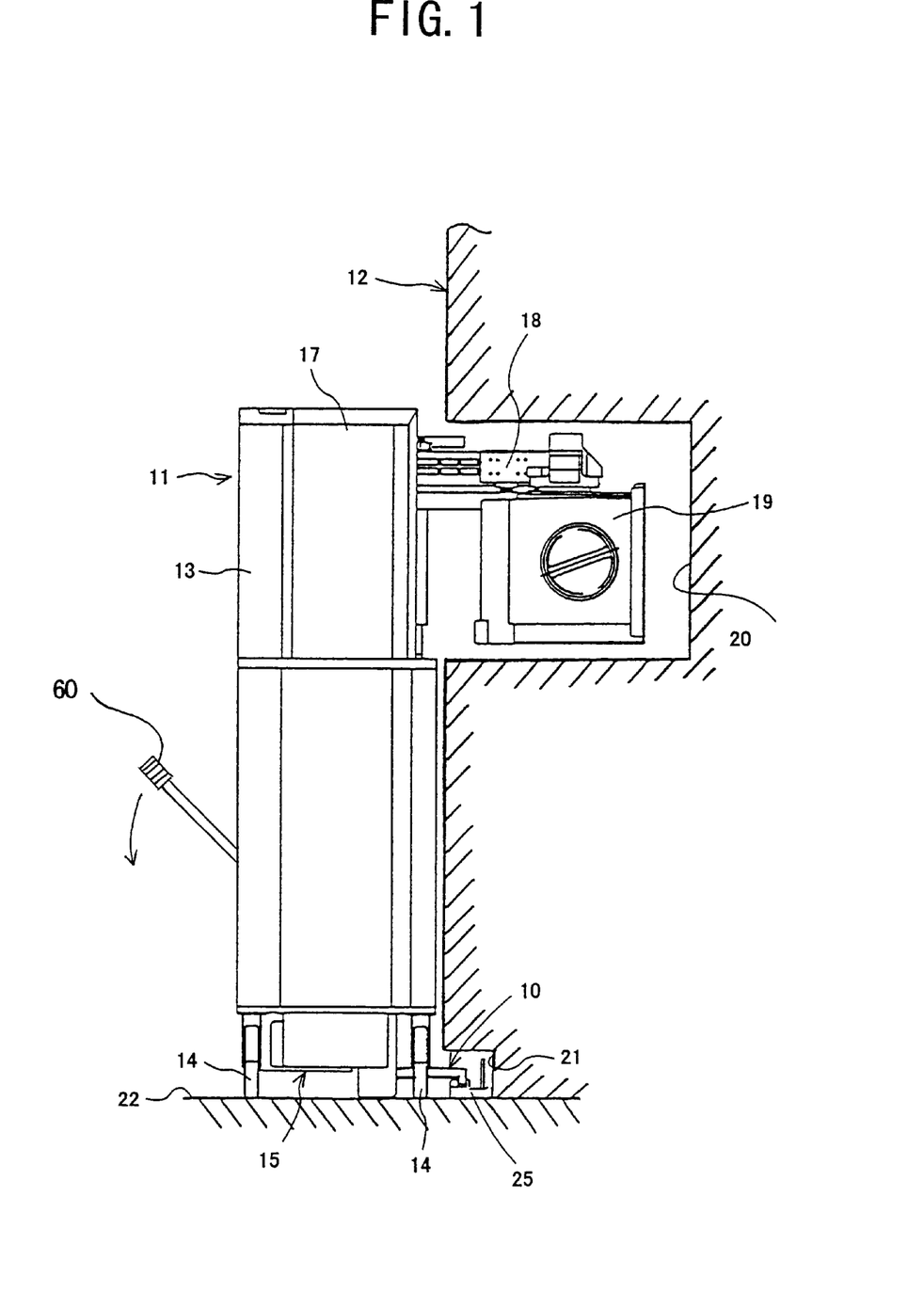
FIG. 1 shows a state in which a conveying cart is fastened to a semiconductor manufacturing apparatus by means of a fastening device in one embodiment of the present invention.
Figure 2:
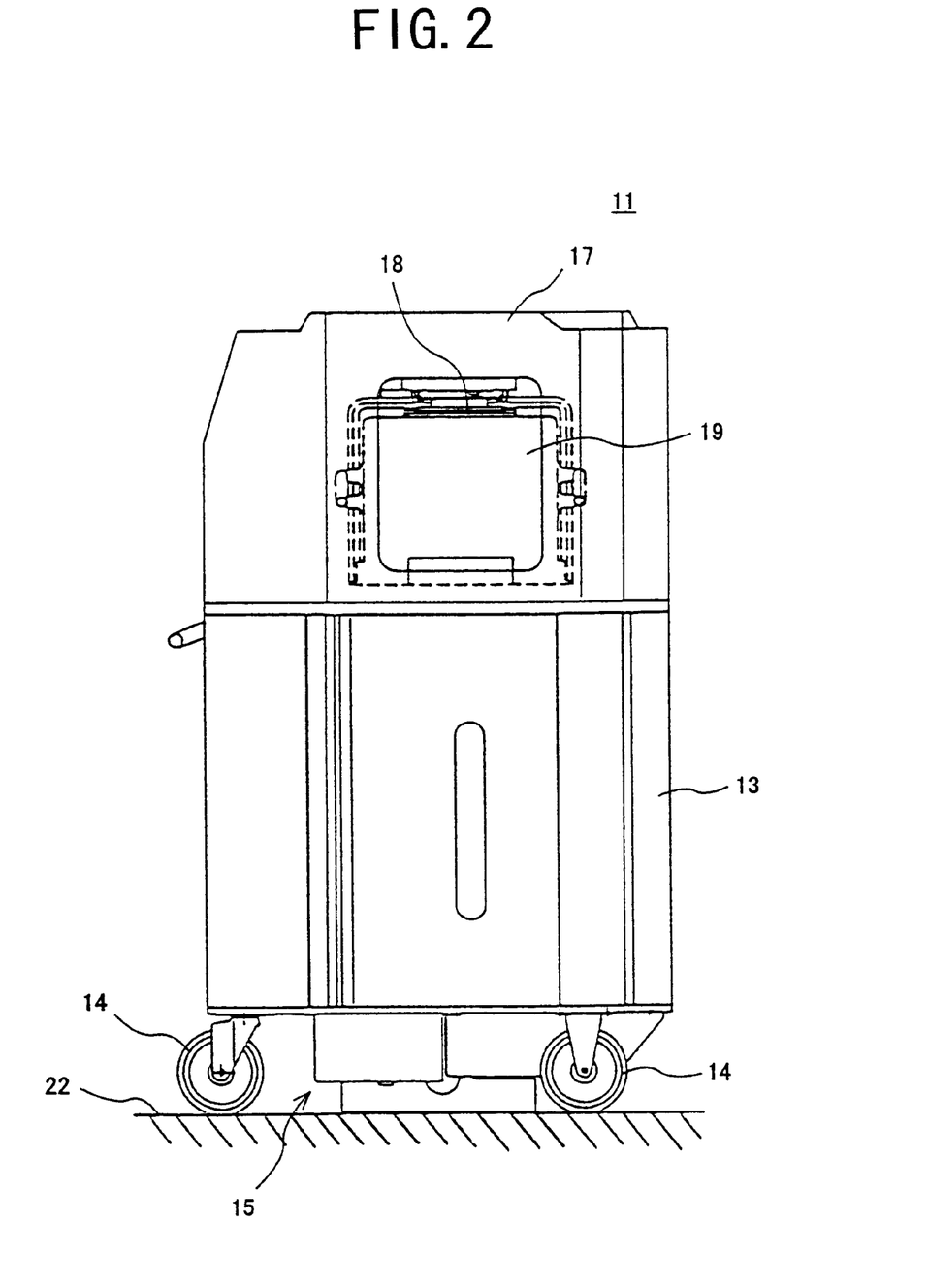
FIG. 2 shows the conveying cart shown in FIG. 1.

FIGS. 1 and 2 show a conveying cart 11 which has a fastening mechanism 15 of a fastening device 10 in one embodiment of the present invention. FIG. 1 shows a state in which the conveying cart 11 is fastened to a semiconductor manufacturing apparatus 12.

In the conveying cart 11, wheels 14 and the fastening mechanism 15 of the fastening device 10 are provided at a bottom part of a cart body 13. As a result of the wheels 14 being provided at the bottom part of the cart body 13, a person can easily move the conveying cart 11. Further, an actuator part 17 is provided at a top part of the cart body 13, and, a work 19 is detachably mounted at an extending end of an actuator arm 18 extending from the actuator part 17.

The actuator arm 18 can be moved three-dimensionally by the actuator part 17. Further, a plurality of semiconductor substrates (wafers of 300 mm, for example) are contained in the work 19 mounted on the actuator arm 18. Accordingly, the work 19 can be moved three-dimensionally by the actuator part 17.

As mentioned above, there are cases where semiconductor substrates should be conveyed manually between respective semiconductor manufacturing apparatuses. In such a case, the conveying cart 11 shown in FIGS. 1 and 2 is used, and, the semiconductor substrates are conveyed in a condition in which the semiconductor substrates are loaded in the work 19 of the conveying cart 11, by a person.

When the semiconductor substrates are thus conveyed to the semiconductor manufacturing apparatus 12, the conveying cart 11 is fastened to the semiconductor manufacturing apparatus 12 by using the fastening device 10. Then, when the conveying cart 11 is fastened to the semiconductor manufacturing apparatus 12, the work 19 mounted on the conveying cart 11 is then loaded to the semiconductor manufacturing apparatus 12.

The semiconductor manufacturing apparatus 12 shown in FIG. 1 has a work loading room 20 into which the work 19 is thus loaded. When the conveying cart 11 is fastened to the semiconductor manufacturing apparatus 12, the work 19 is located in the work loading room 20. Then, in this state, the actuator part 17 is driven, thereby, the actuator arm 18 is moved, and, thereby, the work 19 is loaded at a predetermined position in the work loading room 20.

Further, a handling device not shown in the figures is provided in the semiconductor manufacturing apparatus 12, and, thereby, the semiconductor substrate (300-mm wafer) loaded in the work 19 is conveyed to a predetermined processing part in the semiconductor manufacturing apparatus 12. Then, after a process is performed on the semiconductor substrate by this semiconductor manufacturing apparatus 12, the handling device loads the semiconductor substrates into the work 19 again.

Then, after the process is performed on all the semiconductor substrates contained in the work 19 by the semiconductor manufacturing apparatus 12, the actuator part 17 loads the work 19 into the conveying cart 11 again. Then, when the work 19 is loaded into the conveying cart 11, the operator cancels the fastening by the fastening device 10, and conveys the conveying cart 11 to the other semiconductor manufacturing apparatus which then performs a subsequent process on the semiconductor substrates.

The above-mentioned fastening device 10 for fastening the conveying cart 11 to the semiconductor manufacturing apparatus 12 will now be described in detail.

The fastening device 10 includes the fastening mechanism 15 and a flange 25, generally. As mentioned above, the fastening mechanism 15 is provided at the bottom part of the cart body 13 of the conveying cart 11. The flange 25 is fixed onto a floor 22 in a bottom step part 21 provided at the bottom of the semiconductor manufacturing apparatus 12, as shown in FIG. 1.

Figure 3A:
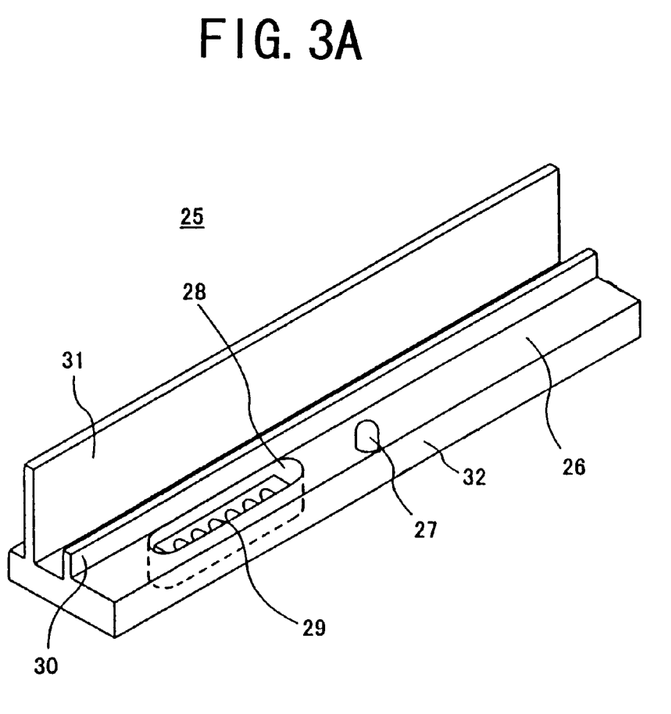
FIGS. 3A and 3B show a flange of the fastening device in the embodiment of the present invention.
Figure 3B:
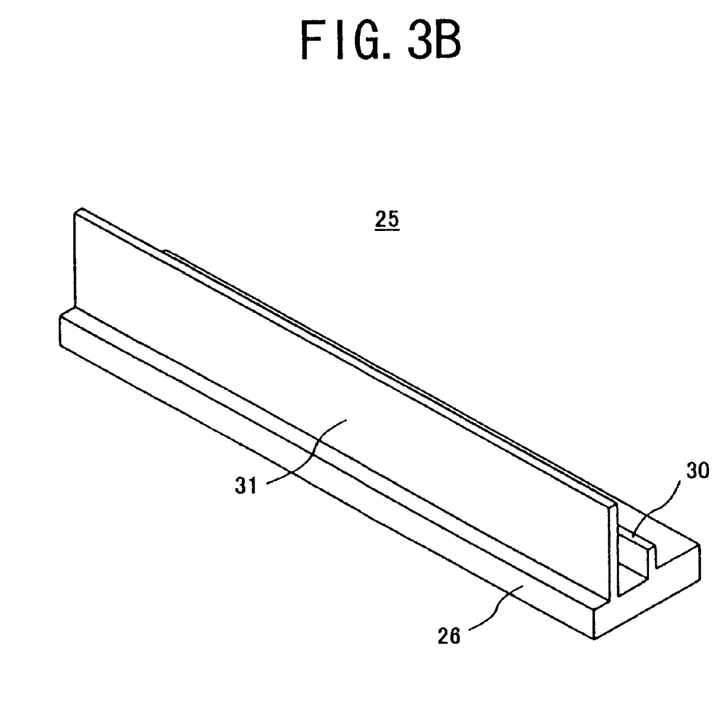

The flange 25 is one to which the conveying cart 11 is fastened, and, has a configuration in accordance with SEMI (Semiconductor Equipment and Materials International) standard, E83. Specifically, as shown in FIGS. 3A and 3B, the flange 25 has a pin 27 standing at a center of a body part 26 thereof with respect to a longitudinal direction, and, also, has a low rib 30 and a high rib 31 also standing from the body part 26.

Recently, a semiconductor wafer is enlarged, and, as mentioned above, a 300-mm wafer is used. Accordingly, it is necessary to configure the semiconductor manufacturing equipment using the 300-mm wafers to be in accordance with the SEMI standard.

In the embodiment of the present invention, the flange 25 is configured to be in accordance with the SEMI standard, E83, and the conveying cart 11 is fastened thereto.

Accordingly, it is possible to use the conveying cart 11 in the semiconductor manufacturing equipment following the SEMI standard, and to use the conveying cart 11 in the manufacturing equipment for the 300-mm wafers.

Figure 7:
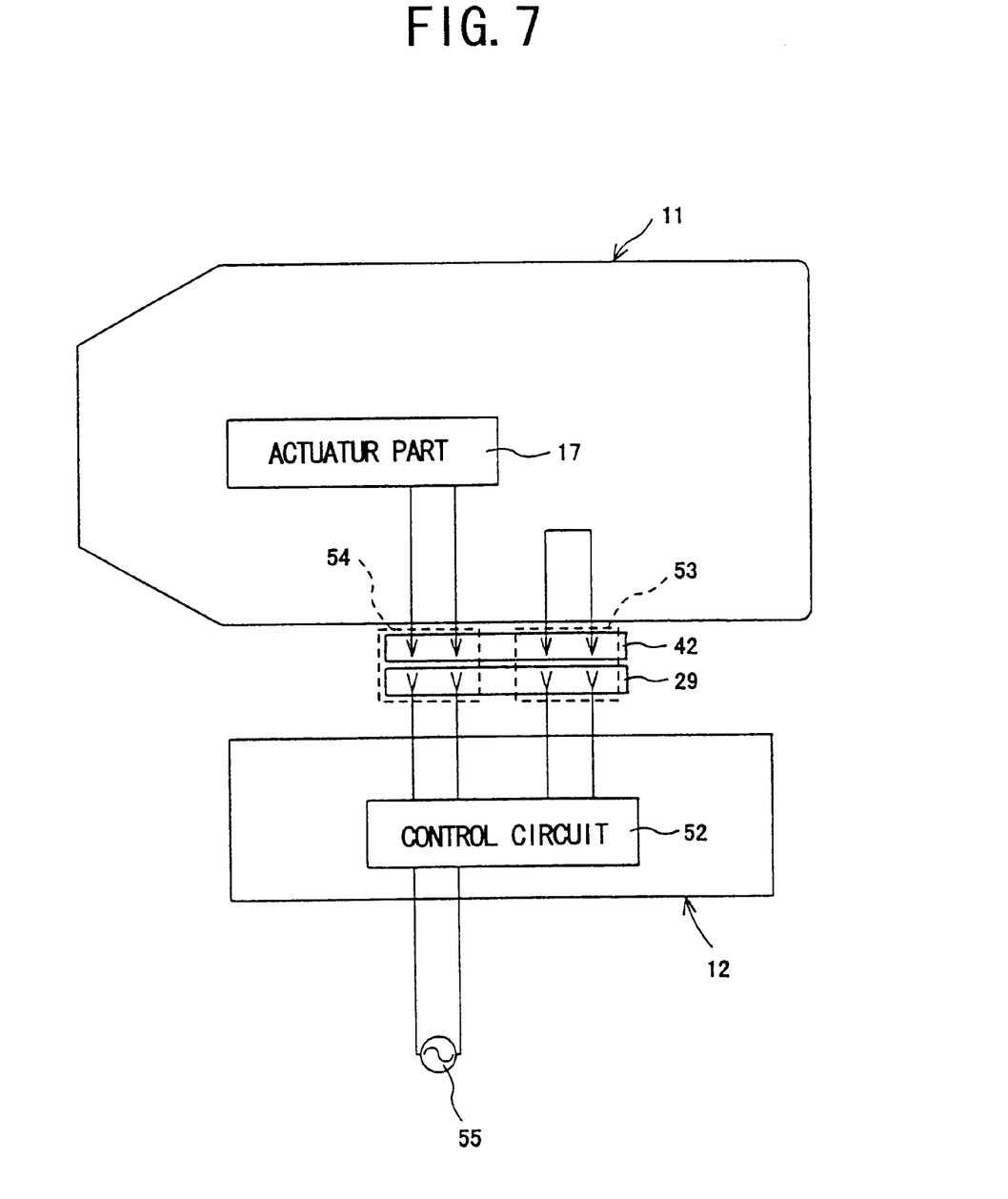
FIG. 7 shows an electric circuit configuration of the fastening device in the embodiment of the present invention.

Further, an engagement hole 28 (recess) is formed in the body part 26 of the flange 25. This engagement hole 28 is provided on one side of the pin 27, and, a power supply unit 29 is provided therein. As the power supply unit 29 is connected to a power receiving unit 42 provided in the conveying cart 11, the power supply unit 29 supplies power to the conveying cart 11. For this purpose, as shown in FIG. 7, the power supply unit 29 is connected with a power source 55.

Operation of a control circuit 52 provided between the power supply unit 29 and power source 55, shown in FIG. 7, will be described later.

Figure 4:
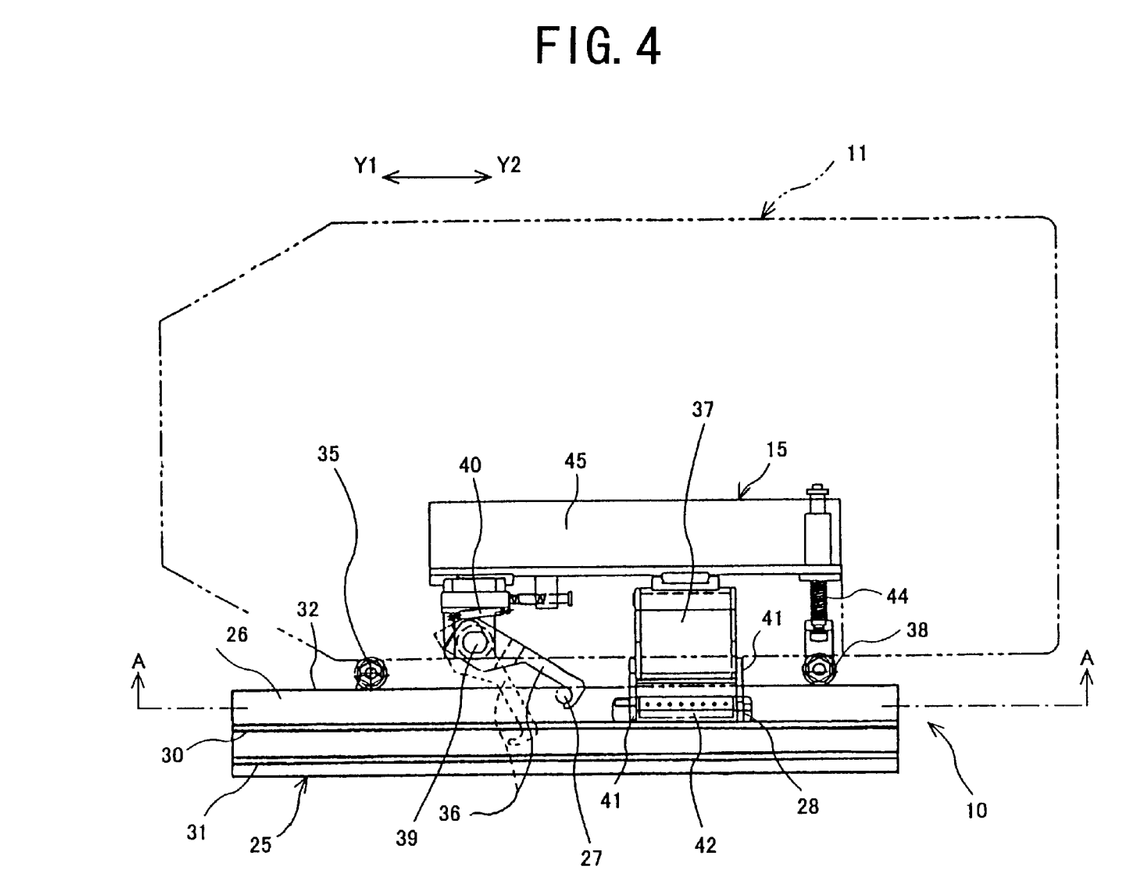
FIG. 4 illustrates a fastening mechanism of the fastening device in the embodiment of the present invention.
Figure 5:
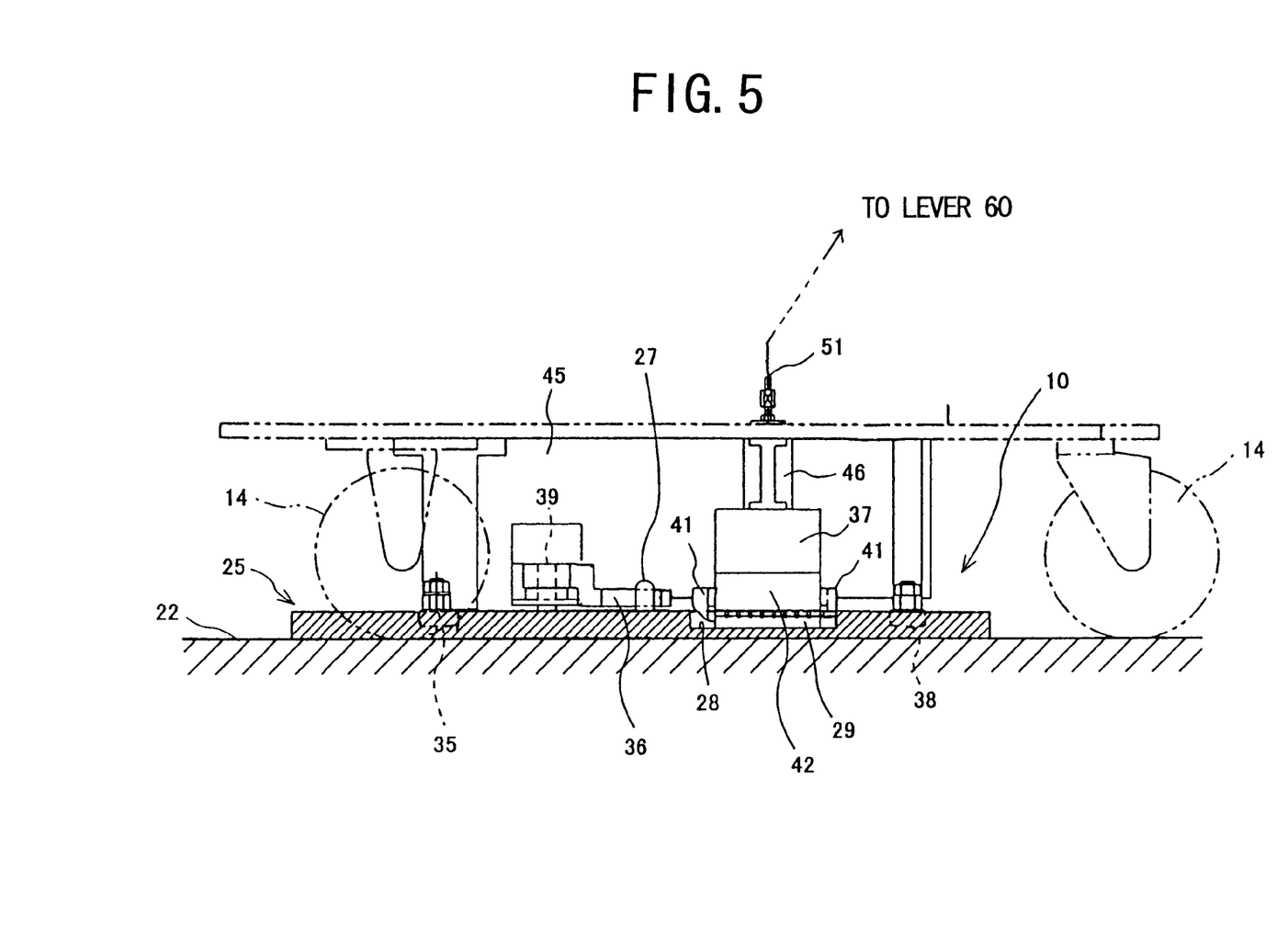
FIG. 5 shows a sectional view taken along a line A—A shown in FIG. 4.
Figure 6:
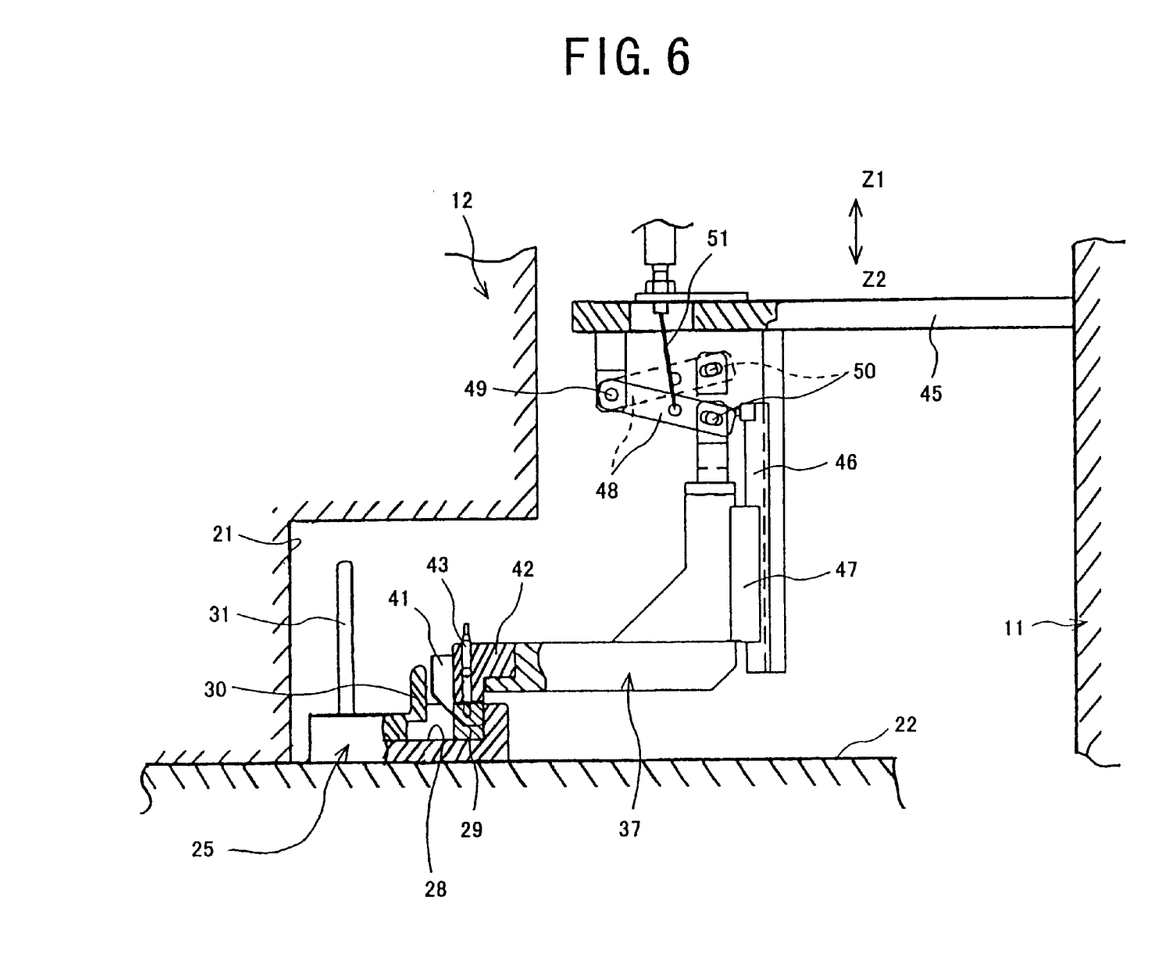
FIG. 6 shows, after magnifying, a fastening hook of the fastening mechanism shown in FIG. 4.

With reference to FIGS. 4, 5 and 6, the above-mentioned fastening mechanism 15 will now be described.

The fastening mechanism 15 generally includes a positioning roller 35, a positioning hook (first hook member) 36, a fastening hook (second hook member) 37, a pressing roller 38, and so forth.

The positioning roller 35 is provided on a side part of the conveying cart 11, and comes into contact with a side surface 32 of the flange 25 when the conveying cart 11 is fastened to the flange 25.

The positioning hook 36 is provided to the right (in an arrow Y2 direction shown in FIGS. 4 and 5) of the positioning roller 35. When the conveying cart 11 is fastened to the flange 25, the positioning hook 36 engages with the pin 27 of the flange 25, and, thereby, positions the conveying cart 11 with respect to the flange 25. For this purpose, an extending end of the positioning hook 36 has a hook shape such as to render an improved performance in engagement with the pin 27.

This positioning hook 36 is mounted on a base member 45 provided in the conveying cart 11, rotatably. Specifically, a shaft 39 stands from the base member 45, and the positioning hook 36 is supported on the shaft 39 rotatably around the shaft 39.

A spring 40 is provided between the positioning hook 36 and base member 45, and, thereby, the positioning hook 36 is pressed so as to rotate clockwise in FIG. 4. Thereby, during a time other than a time at which the conveying cart 11 is fastened to the flange 25, the positioning hook 36 projects obliquely from a side part of the conveying cart 11, as shown by a broken line in FIG. 4.

The fastening hook 37 engages with the engagement hole 28 of the flange 25, and, thereby, fastens the conveying cart 11 to the flange 25. As shown in FIG. 6 in a magnified view, this fastening hook 37 has an approximately L-shape in a side view. Further, the fastening hook 37 has engagement claws 41, the power receiving unit 42, a sliding part 47, a rotating arm 48, a wire 51 and so forth provided thereto.

The engagement claws 41 are provided so as to sandwich the power receiving unit 42 at an extending end part of the fastening hook 37. The engagement claws 41 engage with the engagement hole 28 of the flange 25, and, thereby, fasten the conveying cart 11 to the flange 25 (semiconductor manufacturing apparatus 12). When engaging with the engagement hole 28, the engagement claws 41 make the engagement after climbing over the body part 26 of the flange 25. Therefore, tapers are formed at the outside of the bottom part of the engagement claws 41.

The power receiving unit 42 is electrically connected with the power supply unit 29 provided in the engagement hole 28 of the flange 25, when the conveying cart 11 is fastened to the semiconductor manufacturing apparatus 12. Specifically, terminals 43 are provided in the power receiving unit 42, come into electrically contact with contact parts (not shown in the figures) of the power supply unit 29, and, thereby, the power supply unit 29 and power receiving unit 42 are electrically connected.

As shown in FIG. 7, the power supply unit 29 and power receiving unit 42 cooperatively configure a sensor part 53 and a connector part 54. The sensor part 53 is used for detecting a connection condition between the power supply unit 29 and the sensor part 53, and the detection signal therefrom is transmitted to the control circuit 52. The connector part 54 is used for electrically connecting the power source 55 provided in the semiconductor manufacturing apparatus 12 to the actuator part 17 provided in the conveying cart 11.

Thus, as a result of the conveying cart 11 being fastened to the flange 25 (semiconductor manufacturing apparatus 12), and the power supply unit 29 being connected with the power receiving unit 42 in the connector part 54, the actuator part 17 is connected with the power source 55 via the power receiving unit 42, power supply unit 29 and control circuit 52. At this time, power supplied to the actuator part 17 is controlled by the control circuit 52. Accordingly, the driving of the actuator part 17 is controlled by the control circuit 52.

Operation of the control circuit 52 and a function of the sensor part 53 performed when the fastening hook 37 engages with the engagement hole 28 will now be described.

In the embodiment of the present invention, at a time the fastening hook 37 engages with the engagement hole 28, power is not immediately supplied to the actuator part 17 from the power source 55. Power is supplied to the actuator part 17 from the power source 55 based on a signal obtained through the sensor part 53. That is, after a signal indicating that the power supply unit 29 is electrically connected with the power receiving unit 42 is obtained from the sensor part 53, the control circuit 52 supplies the power of the power source 55 to the power receiving unit 42 from the power supply unit 29.

Accordingly, no power supply is performed from the power source 55 to the actuator part 17 while the power supply unit 29 is not yet electrically connected with the power receiving unit 42. After the control circuit 52 determines based on the signal obtained from the sensor part 53 that the power supply unit 29 is electrically connected with the power receiving unit 42, the control circuit 52 supplies power from the power supply unit 29 to the power receiving unit 42. Thereby, it is possible to prevent power supply from being started from the power source 55 in a connection condition in which electrical connection between the power supply unit 29 and power receiving unit 42 is incomplete. Thus, safe operation can be secured.

With reference to FIGS. 4, 5 and 6, description of the fastening mechanism 15 will now be continued.

The sliding part 47 is provided at a standing part of the fastening hook 37. This sliding part 47 is slidably mounted onto a guiding part 46 provided on the base member 45.

Thereby, the fastening hook 37 is movable in vertical directions in FIG. 6 along the guiding part 46. Further, the fastening hook 37 is always pressed by an elasticity part, not shown in the figure, so as to move downward in FIG. 6 (in an arrow Z2 direction in the figure).

An engagement pin 50 stands at a top end part (at an end in an arrow Z1 direction in FIG. 6) of the fastening hook 37. This engagement pin 50 engages with one end part of the rotating arm 48. Further, the rotating arm 48 is rotatably supported onto the shaft 49 provided onto the base member 45. Accordingly, as the rotating arm 48 rotates around the shaft 49, the fastening hook 37 moves in the arrow Z1 and Z2 directions in FIG. 6 along the guiding part 46.

Further, the rotating arm 48 is pulled by the wire 51 so as to rotate. The bottom end of the wire 51 is fixed to the rotating arm 48, and, also, the top end thereof is connected to an operating lever 60, shown in FIG. 1. This operating lever 60 is provided at a position on the conveying cart 11 such that an operator can easily operate the operating lever 60. As the operator operates the operating lever 60, the operating lever 60 pulls the wire 51.

Thus, when the operator operates the operating lever 60, which thereby pulls the wire 51, the rotating arm 48 connected with the wire 51 is then pulled by the wire 51, and thereby rotates toward a position shown by a broken line from a position shown by a solid line, against an elastic force of the above-mentioned elasticity part, not shown in the figures. Thereby, the fastening hook 37 moves in the arrow Z1 direction in FIG. 6, the engagement claws 41 are separated from the engagement hole 28 and the engagement therebetween is canceled. Also, simultaneously, the power receiving unit 42 is separated from the power supply unit 29 and the electric connection therebetween is canceled.

As the fastening hook 37 is thus separated from the engagement hole 28, the fastening of the conveying cart 11 to the flange 25 is canceled. Thus, the operator can cancel the fastening of the conveying cart 11 to the flange 25 only by operating the operating lever 60. Accordingly, it is easy for the operator to cancel the fastened state. The above-mentioned rotating arm 48, wire 51 and operating lever 60 form an engagement canceling mechanism.

The pressing roller 38 is provided to the right (in an arrow Y2 direction in FIG. 4) of the fastening hook 37, as shown in FIGS. 4 and 5. This pressing roller 38 projects outward from the side part of the conveying cart 11, and is pressed outward by the spring 44.

Further, the pressing roller 38 comes into contact with the side surface 32 of the flange 25 in a condition in which the conveying cart 11 is fastened to the flange 25. Because the pressing roller 38 is elastically pressed by the spring 44 as mentioned above, the pressing roller 38 presses the side surface 32 in the condition in which the pressing roller 38 is in contact with the side surface 32 of the flange 25. The pressing roller 38 and spring 44 form a biasing force generating mechanism.

Figure 8:
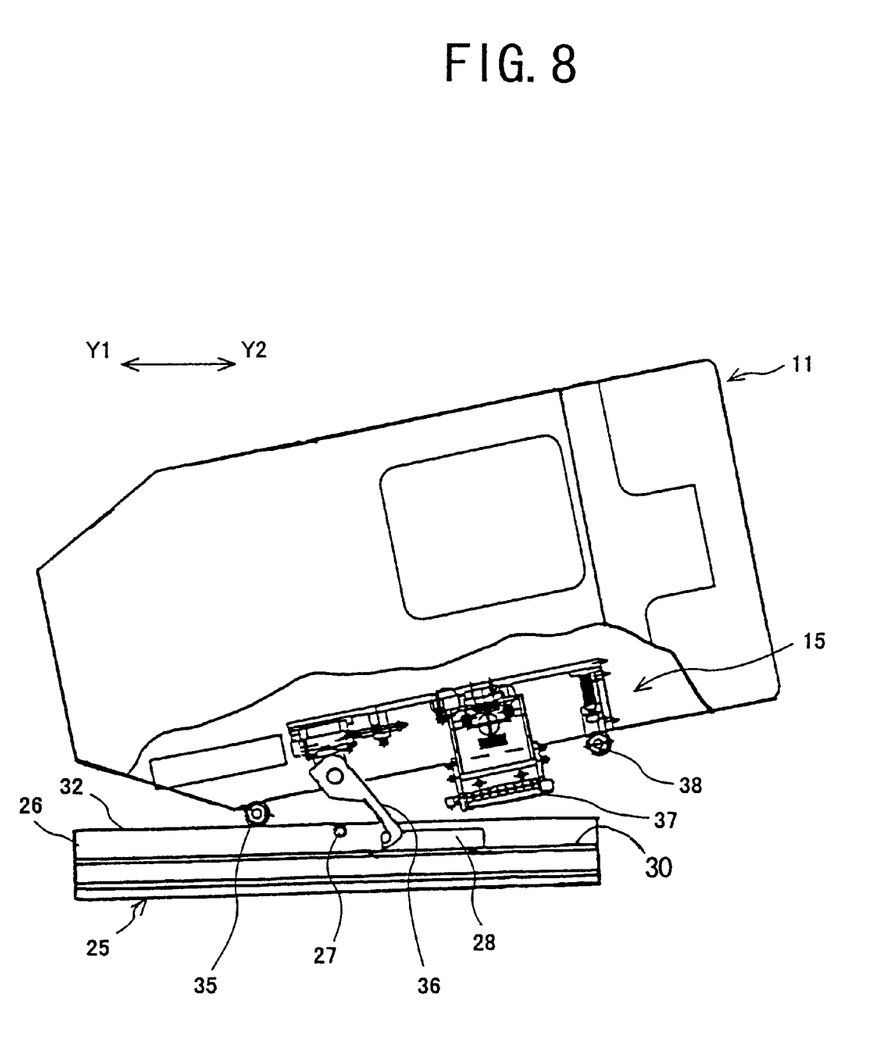
FIGS. 8, 9 and 10 illustrate operation/functions of the fastening device in the embodiment of the present invention.
Figure 9:
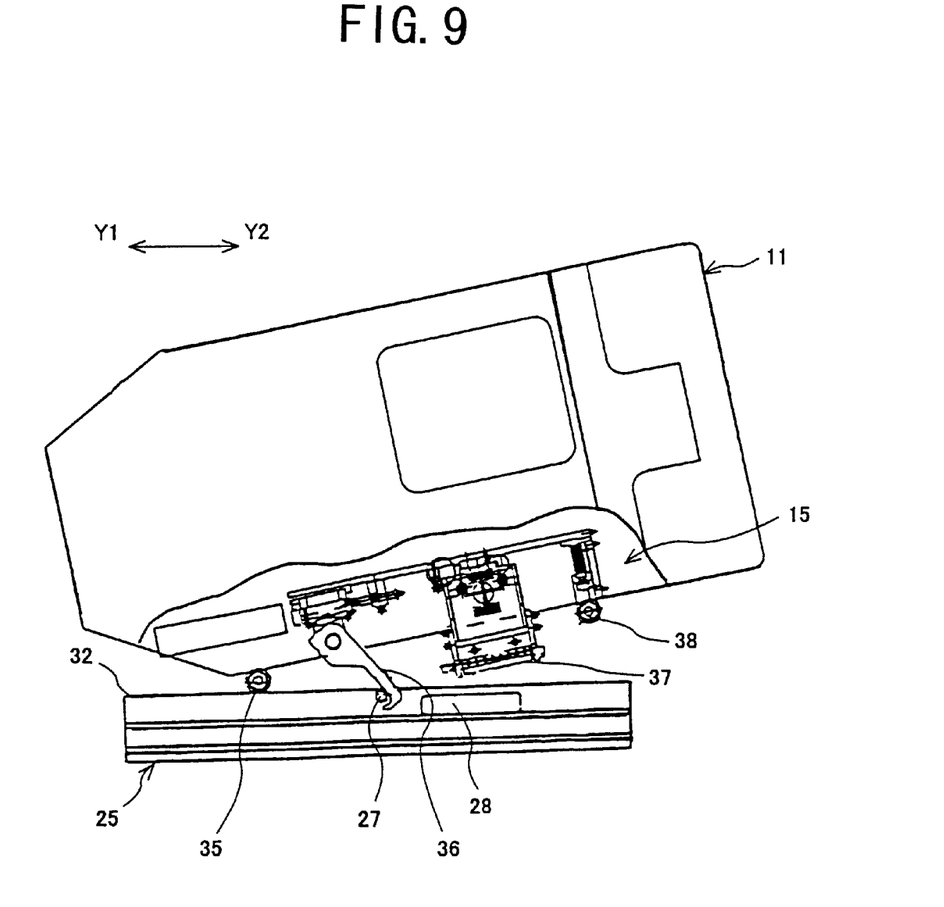
Figure 10:
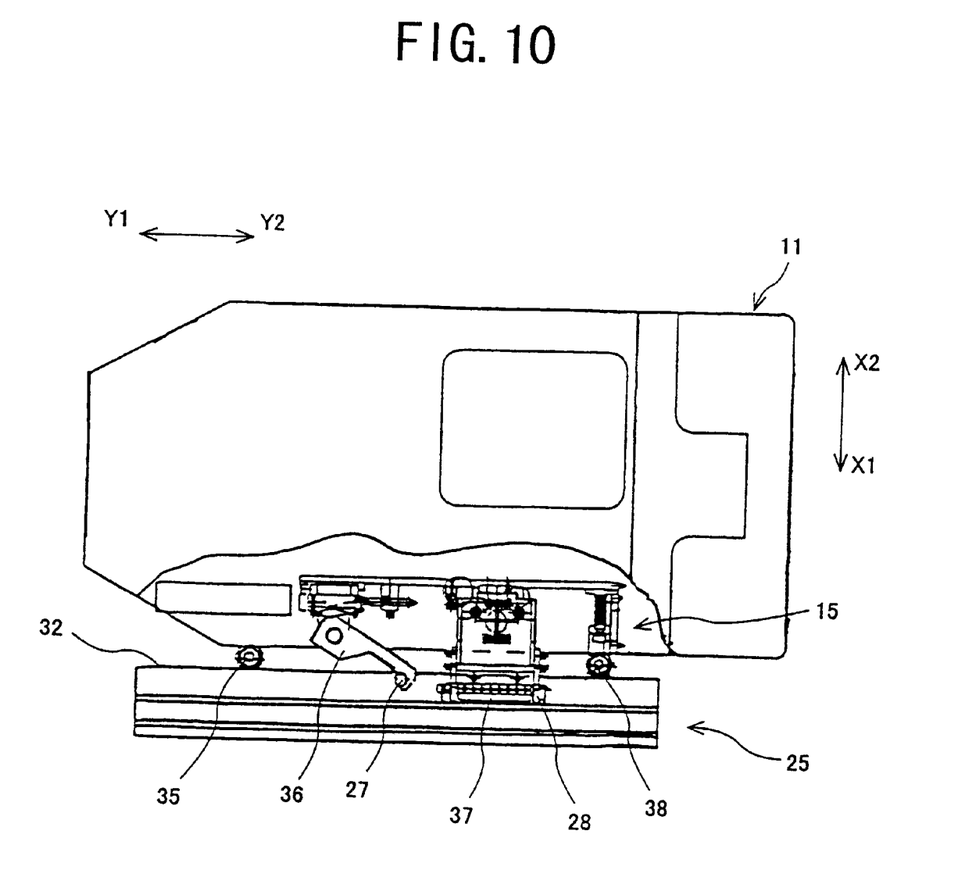

Operation by the above-described fastening device 10 of fastening the conveying cart 11 to the semiconductor manufacturing apparatus 12 (flange 25) will now be described. FIGS. 8, 9 and 10 show operating steps thereof in sequence.

In order to fasten the conveying cart 11 to the semiconductor manufacturing apparatus 12 (flange 25), first, an operator causes the positioning roller 35 provided onto the side part of the conveying cart 11 to come into contact with the side surface 32 of the flange 25, as shown in FIG. 8. At this time, the positioning hook 36 is caused to be located backward with respect to the pin 27 provided onto the flange 25 with respect to a direction in which the conveying cart 11 is thus moved (an arrow Y1 direction in FIG. 8).

Thereby, the position at which the positioning roller 35 is provided on the conveying cart 11 is positioned as a result of being guided by the flange 25. However, the positioning at this time is not one fixing the position of the conveying cart 11, and, the conveying cart 11 can move in arrow Y1, Y2 directions in the figure along the side surface 32 of the flange 25.

Then, the operator further moves the conveying cart 11 toward the semiconductor manufacturing apparatus 12 (flange 25) while moving it in the arrow Y1 direction. As mentioned above, the positioning hook 36 extends obliquely backward on the side part of the conveying cart 11. Thereby, as the conveying cart 11 is moved toward the flange 25, the positioning hook 36 comes into contact with the low rib 30 formed on the flange 25. Then, as the conveying cart 11 is moved in the arrow Y1 direction in the figure, the positioning hook 36 moves in the arrow Y1 direction along the low rib 30.

Then, as the hook-shape part at the extending end of the positioning hook 36 reaches the position at which the pin 27 is formed on the flange 25, as shown in FIG. 9, the positioning hook 36 engages with the pin 27. Thereby, the conveying cart 11 and flange 25 are prevented from moving with respect to each other, by the positioning hook 36.

In this state, as the conveying cart 11 is further moved in the arrow Y1 direction, the positioning hook 36 rotates so that the conveying cart 11 approaches the flange 25. Thereby, also the fastening hook 37 provided on the conveying cart 11 approaches the engagement hole 28 formed in the flange 25.

At this time, guidance of movement (that is, positioning) of the conveying cart 11 with respect to the flange 25 is made both at the position at which the positioning roller 35 is in contact with the side surface 32 and at the position at which the positioning hook 36 engages with the pin 27. Accordingly, in comparison to a case where the guidance is made only by the positioning hook 36, it is possible to easily and precisely perform the guidance of movement of the conveying cart 11 with respect to the flange 25.

Then, as the conveying cart 11 is further caused to approach the flange 25, the fastening hook 37 climbs over the body part 26 of the flange 25, and, the engagement claws 41 formed at the extending end of the fastening hook 37 are inserted into the engagement hole 28. Thereby, as shown in FIG. 10, the fastening hook 37 engages with the engagement hole 28.

At this time, as mentioned above, the fastening hook 37 is pressed downward (in the arrow Z2 direction in FIG. 6) by the elasticity part, not shown in the figures. Thereby, the fastening hook 37 is positively engages with the engagement hole 28. As a result, the conveying cart 11 is fastened to the semiconductor manufacturing apparatus 12 (flange 25).

When this fastening operation is performed, the operator should not check by his or her eyes the condition of engagement between the fastening mechanism 15 and flange 25. The operator merely moves the conveying cart 11 in the arrow Y1 direction while causing the positioning roller 35 to be in contact with the side surface 32 of the flange 25, and, after the positioning hook 36 engages with the pin 27 of the flange 25, moves the conveying cart 11 so as to cause it to approach the flange 25. Only thereby, it is possible for the operator to fasten the conveying cart 11 to the semiconductor manufacturing apparatus 12 (flange 25). Accordingly, by the fastening device 10 in the embodiment of the present invention, it is possible to easily fasten the conveying cart 11 to the semiconductor manufacturing apparatus 12 (flange 25).

Further, as mentioned above, the power supply unit 29 is provided in the engagement hole 28, and the power receiving unit 42 is provided at the extending end of the fastening hook 37. Then, as the fastening hook 37 engages with the engagement hole 28, the power receiving unit 42 is connected with the power supply unit 29.

Accordingly, by the configuration according to the present invention, it is possible to perform both the operation of fastening the conveying cart 11 to the semiconductor manufacturing apparatus 12 (flange 25) and the operation of electrically connecting the conveying cart 11 with the semiconductor manufacturing apparatus 12 simultaneously. Thereby, it is possible to simplify the operation performed at the time of fastening in total. Further, because power is supplied from the semiconductor manufacturing apparatus 12 to the conveying cart 11, it is not necessary to provide a power source in the conveying cart 11. Accordingly, it is possible to simplify the configuration of the conveying cart 11.

Further, in the condition in which the conveying cart 11 is fastened to the semiconductor manufacturing apparatus 12 (flange 25), the pressing roller 38 comes into contact with the side surface 32 of the flange 25. At this time, because the pressing roller 38 is pressed by the spring 44 outward, the pressing roller 38 presses the side surface 32 of the flange 25.

As the pressing roller 38 thus presses the side surface 32 of the flange 25, a force is applied to the conveying cart 11 such that the conveying cart 11 will be separated from the flange 25 (this force being referred to as a biasing force, hereinafter). This biasing force is also applied at the position at which the engagement hole 28 engages with fastening hook 37.

The direction in which this biasing force is applied at the engagement position between the engagement hole 28 and fastening hook 37 is such that this biasing force functions to press the engagement claws 41 of the fastening hook 37 against an inner wall of the engagement hole 28.

Thus, this biasing force functions to increase the engagement force between fastening hook 37 and engagement hole 28. Accordingly, by providing the pressing roller 38, it is possible to perform fastening between the conveying cart 11 and semiconductor manufacturing apparatus 12 (flange 25) more positively.

In order to cancel the fastened state between the conveying cart 11 and semiconductor manufacturing apparatus 12 (flange 25), the operator merely should operate the operating lever 60 provided on the conveying cart 11 mentioned above. Thereby, the fastening hook 37 is separated from the engagement hole 28, and, thus, it is possible to cancel the fastened state easily.

Further, in the above-described embodiment, the configuration of conveying the 300-mm wafers by the conveying cart 11 has been described, for example. However, the present invention is not limited to being applied to the conveying cart 11 conveying semiconductor substrates, and, may also be applied to a conveying cart which conveys components/parts such as liquid crystal substrates or the like, for example, other than semiconductor substrates.

As described above, in the fastening device according to the present invention, the pin (27) stands at a central position of the flange (25) with respect to a longitudinal direction thereof, and the flange further includes the low rib (30) and high rib (31) each standing and extending along the longitudinal direction.

The above-described flange is based on SEMI (Semiconductor Equipment and Materials International) standard. Accordingly, according to the present invention, it is possible to positively fasten the conveying cart to the to-be-fastened apparatus in a semiconductor manufacturing equipment dealing with 300-mm wafers.

That is, recently, a semiconductor wafer is enlarged, and, the 300-mm wafer is used. Accordingly, it is necessary to configure the semiconductor manufacturing equipment using the 300-mm wafers to be in accordance with the SEMI standard.

The SEMI standard concerning the flange is prescribed in E83. Accordingly, by causing the flange to follow the E83 of SEMI standard, and, providing a configuration such that the conveying cart 11 is fastened thereto, it is possible to use the conveying cart in the semiconductor manufacturing equipment following the SEMI standard, and, thereby, to use the conveying cart for conveying the 300-mm wafers.

The fastening device further includes the power supply unit (29) in the recess (28) and the power receiving unit (42) on the second hook member (37), the power supply unit and power receiving unit being electrically connected as a result of the second hook member engaging with the recess.

Thereby, the power supply unit is electrically connected with the power receiving unit when the conveying cart is fastened to the to-be-fastened apparatus. Accordingly, it is possible to perform both the operation of fastening the conveying cart to the to-be-fastened apparatus and the operation of electrically connecting the power supply unit with the power receiving unit, simultaneously. Thus, it is possible to simplify the operation of fastening totally. Further, because the conveying cart receives power from the to-be-fastened apparatus, it is not necessary to provide a power source in the conveying cart, and it is possible to simplify the configuration of the conveying cart.

The control device is provided in at least one of the conveying cart (11) and to-be-fastened apparatus (12), and, also, the sensor part (53) for detecting electrical connection between the power supply unit and power receiving unit is provided, and the control device supplies power from the power supply unit to the power receiving unit after the electrical connection between the power supply unit and power receiving unit is detected based on a signal obtained from the sensor part.

Thereby, unless the power supply unit and power receiving unit are electrically connected, no power supply is made therebetween. Accordingly, it is possible to prevent power supply from being started in a condition in which electrical connection between the power supply unit and power receiving unit is incomplete. Thereby, it is possible to secure safety.

The fastening device further includes the engagement canceling mechanism (48, 51 and 60) for canceling engagement between the second hook member and recess.

By using the engagement canceling mechanism, it is easy for an operator to cancel the engagement between the second hook member and recess.

The engagement canceling mechanism includes the operation lever (60) operated by the operator and the wire (51) connecting between the operating lever and second hook member, engagement between the second hook member and recess being cancelled as a result of the operating lever being operated by the operator.

Thereby, when the operator operates the operating lever, the wire is pulled thereby, and, as a result, the second hook member is separated from the recess. Accordingly, only operation of the operating lever by the operator can cancel the engagement between the conveying cart and to-be-fastened apparatus, and, as a result, the operation performed by the operator for the engagement cancellation is simplified.

The fastening device further includes the roller (38) on the fastening mechanism (15) for positioning the conveying cart with respect to the to-be-fastened apparatus as a result of the roller coming into contact with a side surface of the flange.

Thereby, positioning of the conveying cart with respect to the to-be-fastened apparatus is performed not only through the first hook member but also through the contact of the roller with the side surface of the flange. Accordingly, positioning of the conveying cart with respect to the to-be-fastened apparatus at the time of fastening can be performed easily.

The fastening device further includes the biasing force generating mechanism (38, 44) on the fastening mechanism generating the biasing force between the to-be-fastened apparatus and fastening mechanism, the biasing force functioning as an engagement force by pressing a side surface of the flange.

Thereby, while the conveying cart is fastened to the to-be-fastened apparatus, the biasing force generating mechanism presses the side surface of the flange. Accordingly, the biasing force occurs between the to-be-fastened apparatus and fastening mechanism, specifically, between the second hook member and recess. This biasing force functions as a force preventing the second hook member being separated from the recess. As a result, the fastening between the conveying cart and to-be-fastened apparatus can be made positively.

The present invention is not limited to the above-described embodiment, and variations and modifications may be made without departing from the scope of the present invention.

The present application is based on Japanese priority application No. 2000-248926, filed on Aug. 18, 2000, the entire contents of which are hereby incorporated by reference.

What is claimed is:

1. A fastening device for a conveying cart, used for fastening the conveying cart to a to-be-fastened apparatus, comprising:

a flange provided on a side of said to-be-fastened apparatus of said device, and having a pin standing therefrom, and a recess formed therein; and a fastening mechanism provided on a side of said conveying cart of said device, and having a first hook member engaging with said pin of said flange so as to position said conveying cart with respect to said to-be-fastened apparatus, and a second hook member engaging with said recess of said flange so as to fasten said conveying cart to said to-be-fastened apparatus.

2. The device as claimed in claim 1, wherein:

said pin stands at a central position of said flange with respect to a longitudinal direction thereof; and said flange further comprises a low rib and a high rib each standing and extending along the longitudinal direction.

3. The device as claimed in claim 1, further comprising an engagement canceling mechanism for canceling engagement between said second hook member and recess.

4. The device as claimed in claim 1, further comprising a roller in said fastening mechanism for positioning said conveying cart with respect to said to-be-fastened apparatus as a result of said roller coming into contact with a side surface of said flange.

5. The device as claimed in claim 1, further comprising a biasing force generating mechanism in said fastening mechanism generating a biasing force between said to-be-fastened apparatus and fastening mechanism, the biasing force functioning as an engagement force therebetween by pressing a side surface of said flange.

6. A fastening device for a conveying cart, used for fastening the conveying cart to a to-be-fastened apparatus, comprising:

a flange provided on a side of said to-be-fastened apparatus of said device, and having a pin standing therefrom, and a recess formed therein;

a fastening mechanism provided on a side of said conveying cart of said device, and having a first hook member engaging with said pin of said flange so as to position said conveying cart with respect to said to-be-fastened apparatus, and a second hook member engaging with said recess of said flange so as to fasten said conveying cart to said to-be-fastened apparatus; and a power supply unit in said recess and a power receiving unit on said second hook member, said power supply unit and power receiving unit being electrically connected as a result of said second hook member engaging with said recess.

7. The device as claimed in claim 6, wherein:

a control device is provided in at least one of said conveying cart and to-be-fastened apparatus, and, also, a sensor part for detecting electrical connection between said power supply unit and power receiving unit is provided; and said control device supplies power from said power supply unit to said power receiving unit after the electrical connection between said power supply unit and power receiving unit is detected based on a signal obtained from said sensor part.

8. A fastening device for a conveying cart, used for fastening the conveying cart to a to-be-fastened apparatus, comprising:

a flange provided on a side of said to-be-fastened apparatus of said device, and having a pin standing therefrom, and a recess formed therein;

a fastening mechanism provided on a side of said conveying cart of said device, and having a first hook member engaging with said pin of said flange so as to position said conveying cart with respect to said to-be-fastened apparatus, and a second hook member engaging with said recess of said flange so as to fasten said conveying cart to said to-be-fastened apparatus; and an engagement canceling mechanism for canceling engagement between said second hook member and recess, wherein said engagement canceling mechanism comprises an operation lever operated by an operator and a wire connecting between said operating lever and second hook member, engagement between said second hook member and recess being cancelled as a result of said operating lever being operated by the operator.

9. A conveying cart for conveying components/parts to a manufacturing apparatus, comprising a fastening mechanism of a fastening device used for fastening said conveying cart to the manufacturing apparatus, said fastening device comprising:

a flange provided on a side of said manufacturing apparatus of said device, and having a pin standing therefrom, and a recess formed therein; and said fastening mechanism provided on a side of said conveying cart of said device, and having a first hook member engaging with said pin of said flange so as to position said conveying cart with respect to said manufacturing apparatus, and a second hook member engaging with said recess of said flange so said to fasten said conveying cart to said manufacturing apparatus.

10. A fastening mechanism of a fastening device used for fastening a conveying cart to a to-be-fastened apparatus, said fastening device comprising:

a flange provided on a side of said to-be-fastened apparatus of said device, and having a pin standing therefrom, and a recess formed therein; and said fastening mechanism provided on a side of said conveying cart of said device, and having a first hook member engaging with said pin of said flange so as to position said conveying cart with respect to said to-be-fastened apparatus, and a second hook member engaging with said recess of said flange so said to fasten said conveying cart to said to-be-fastened apparatus.

11. A flange of a fastening device used for fastening a conveying cart to a to-be-fastened apparatus, said fastening device comprising:

said flange provided on a side of said to-be-fastened apparatus of said device, and having a pin standing therefrom, and a recess formed therein; and a fastening mechanism provided on a side of said conveying cart of said device, and having a first hook member engaging with said pin of said flange so as to position said conveying cart with respect to said to-be-fastened apparatus, and a second hook member engaging with said recess of said flange so said to fasten said conveying cart to said to-be-fastened apparatus.

* * * * *